United States Patent [19]

Hardee et al.

[11] Patent Number: 4,471,374
[45] Date of Patent: Sep. 11, 1984

[54] SINGLE POLYCRYSTALLINE SILICON MEMORY CELL

[75] Inventor: Kim C. Hardee, Manitou Springs, Colo.

[73] Assignee: Inmos Corporation, Colorado Springs, Colo.

[21] Appl. No.: 164,285

[22] Filed: Jun. 30, 1980

[51] Int. Cl.³ .................. H01L 27/04; H01L 29/78; G11C 11/00
[52] U.S. Cl. ....................................... 357/59; 357/23; 357/41; 357/51; 365/154
[58] Field of Search ................... 357/41, 51, 59, 23 S; 365/154

[56] References Cited

U.S. PATENT DOCUMENTS

| | | | |
|---|---|---|---|
| 4,110,776 | 8/1978 | Rao et al. | 357/51 |
| 4,240,097 | 12/1980 | Raymond, Jr. | 357/59 |
| 4,246,593 | 1/1981 | Bartlett | 357/45 |
| 4,280,271 | 7/1981 | Lou et al. | 357/59 |
| 4,322,824 | 3/1982 | Allan | 357/41 |

*Primary Examiner*—William D. Larkins
*Attorney, Agent, or Firm*—Edward D. Manzo

[57] ABSTRACT

A single polycrystalline silicone configuration for a memory cell in a static MOS RAM and a method of fabricating the same are described. Three conductivity regions are utilized to form each memory cell. A first conductivity region is formed in the substrate to create a buried ground line and sources and drains of transistors. A second conductivity region is formed within an insulation layer and above the first conductivity region to create a word line, gate regions of the transistors, load resistors, and a power supply line. The power supply line is oriented directly above and parallel to the ground line. A third conductivity region is formed on the surface of the insulation layer to create data lines. The number of process steps and the size of the memory cell are reduced by this configuration.

34 Claims, 6 Drawing Figures

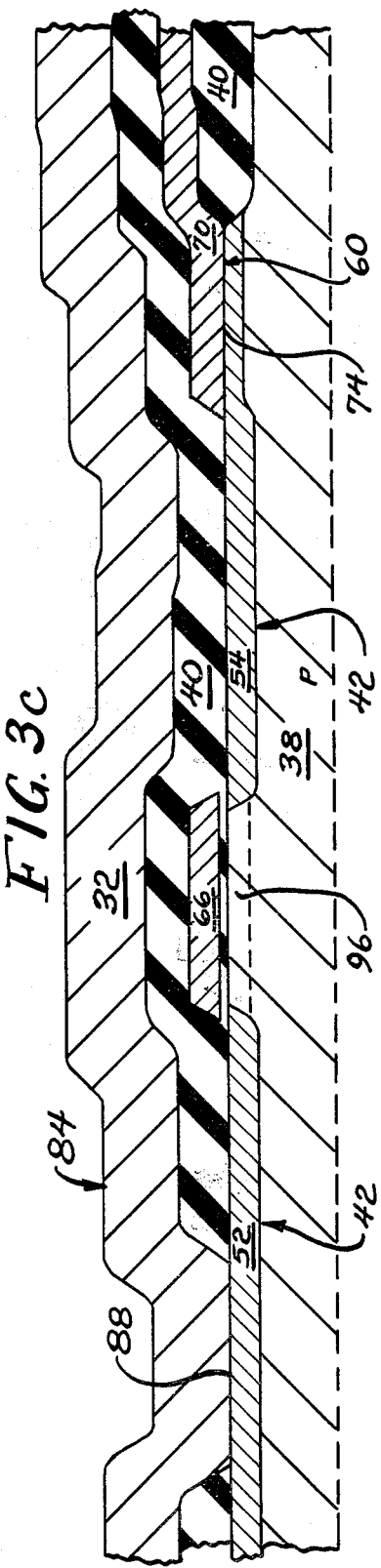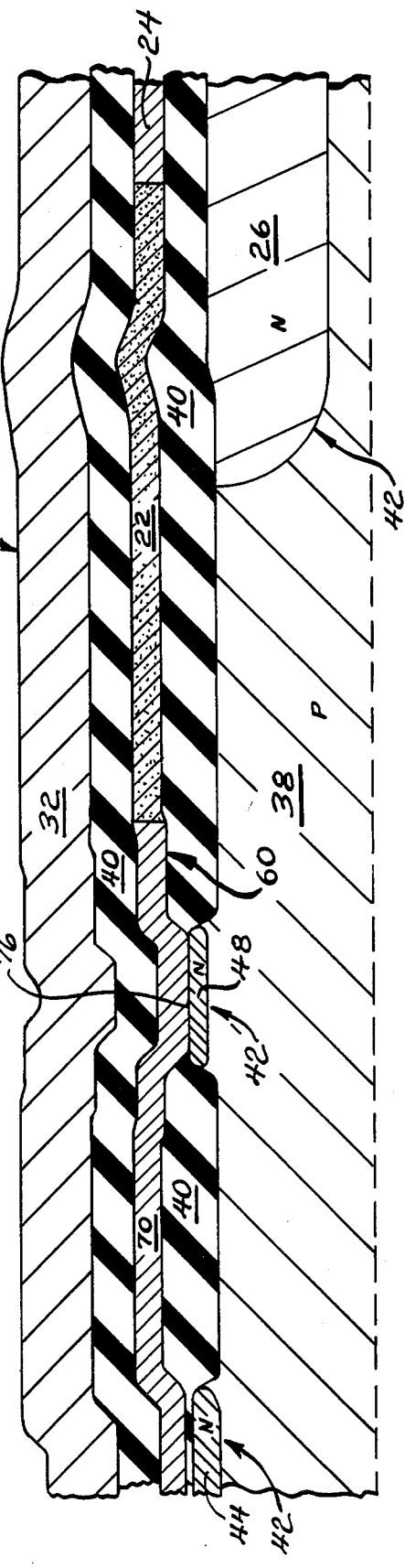

SINGLE POLYCRYSTALLINE SILICON MEMORY CELL

BACKGROUND OF THE INVENTION

The invention relates to the field of metal-oxide-semiconductor (MOS) configurations for MOS random access memories (RAMs) and, more particularly, to a memory cell configuration for static MOS RAMs.

Static MOS RAMs typically employ bistable, flip-flop circuits as memory cells for storing binary data. One particularly useful flip-flop circuit configured from four transistors and two resistor loads is frequently utilized in various memory cell structures because of its small size and low power requirements.

Conventionally, memory cells are fabricated with a single polycrystalline silicon (polysilicon) layer combined with an aluminum layer for forming transistors as well as interconnects in each memory cell. In particular, the aluminum layer is utilized for a power supply (Vcc) interconnect, a ground line (Vss) interconnect, and data line interconnects. While functioning adequately, the metal interconnects take up valuable space on a processed silicon wafer because all critical interconnect levels are in the same plane. This results in a smaller yield per wafer. The yield problem has been, in part, overcome by connecting the resistor loads to the bit lines which extend through the cell for accessing the cell, thereby eliminating the metal line for the Vcc connection and, thus, making the cell size smaller. More recently, the cell size has been further reduced by introducing a second polysilicon layer into the cell. The second polysilicon layer is used to form both the Vcc interconnect and the load resistors while an aluminum layer is used as a data line interconnect. An N+ diffusion silicon layer is used for the Vss interconnect.

Although the memory cell has diminished in size due to the layered levels, other yield problems are precipitated by the double polysilicon configuration. One problem area occurs from the second polysilicon layer intersecting with a buried contact region. Any such intersection with a buried contact region increases the defect density of the processed wafer.

The double polysilicon configuration creates a further yield problem because the additional layer of polysilicon requires creating an additional layer of silicon dioxide to isolate the polysilicon layer from whatever layer the polysilicon is adjacent to. This results in more process stages or steps. The increase of steps in the fabrication process has an inverse impact on the yield of the silicon wafer.

OBJECTS OF THE INVENTION

A general object of the invention is to produce a memory cell configuration for static MOS RAMs which is reduced in size as compared to the conventional, single polysilicon configuration.

Another object of the invention is to reduce the number of process steps and interconnect levels, thereby increasing the yield of a processed wafer, as compared to the typical, double polysilicon configuration.

BRIEF DESCRIPTION OF THE DRAWINGS

The above objects and further objects of the invention will be realized more particularly from the description of the preferred embodiment and from the accompanying drawings, of which:

FIGS. 3a–3d are cross-section, elevational views of the cell of FIG. 1, including the insulation region and the substrate, taken along the lines a—a, b—b, c—c, and d—d, respectively.

SUMMARY OF THE INVENTION

The invention overcomes the disadvantages of the prior art by providing a single, polysilicon configuration for static MOS RAMs wherein three different types of conductive layers or regions are utilized to form the circuitry of each memory cell. The regions are isolated from each other, except for circuitry interconnections, by an insulation region. A first conductive region of N+ type silicon is formed in selected portions of the substrate to create the buried ground line and the source region and the drain regions of the transistors of the memory cell. A second conductive region of polysilicon is formed above the first region to create the word line, the gate regions of the transistors, the load resistors, and the power supply line of the memory cell. A metal region is formed above the first and second conductivity regions to create a pair of parallel data lines. The size of the memory cell is reduced because the buried ground line is directly below and oriented to run parallel to the power supply line portion of the polysilicon region. In addition, the number of process steps and interconnect levels is reduced by the use of a single polysilicon layer or region. As a result, the yield per silicon wafer is enhanced.

DETAILED DESCRIPTION OF THE INVENTION

Figure 1:
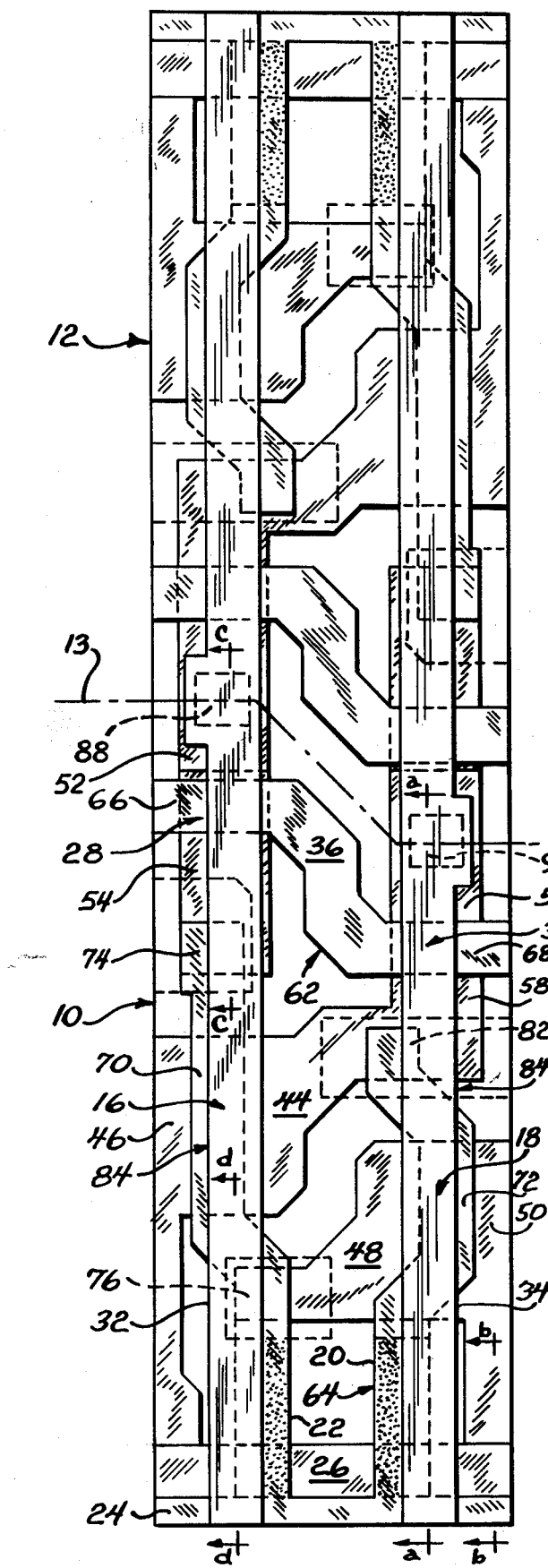
FIG. 1 is an enlarged plan view of a pair of shared memory cells from a static memory array on a semiconductor chip illustrating only the three conductive regions therein.

Referring to FIG. 1, a pair of static RAM cells 10 and 12 from a static memory array depict the preferred embodiment of the invention. For purposes of illustration, the cells 10 and 12 are separated by a dotted line 13 in FIG. 1. Also, only the conductive regions and contacts of the two cells are shown. Contact oxide cuts are shown by the dotted boxes in FIG. 1. Each memory cell in the static memory array shares common elements or components with adjacent memory cells. The manner in which components are shared will be discussed in more detail later in the description.

Figure 2:
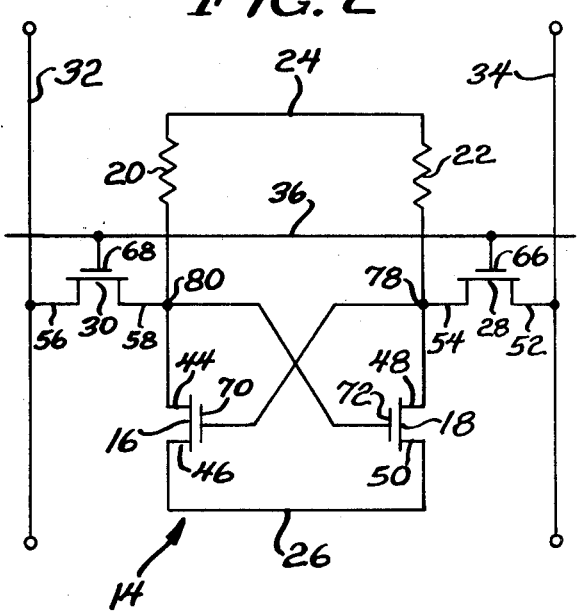
FIG. 2 is an electrical schematic diagram of one of the cells of FIG. 1.

FIG. 2 illustrates the electrical circuitry of cell 10. The cell includes a standard flip-flop 14 arranged from a pair of cross-coupled driver transistors 16 and 18, a pair of load resistors 20 and 22, a power supply or Vcc line 24, and a ground or Vss line 26. A pair of transfer transistors 28 and 30 are coupled to the flip-flop 14 and arranged in conjunction with a pair of data lines 32 and 34 and a word line 36 for accessing data in the flip-flop 14. The components of cell 10 are fabricated on or on top of a substrate 38 of semiconductor material and are isolated from each other, except for electrical connections, by an insulation region 40, as shown in FIGS. 3a–3d, which is preferably silicon dioxide.

Figure 3A:
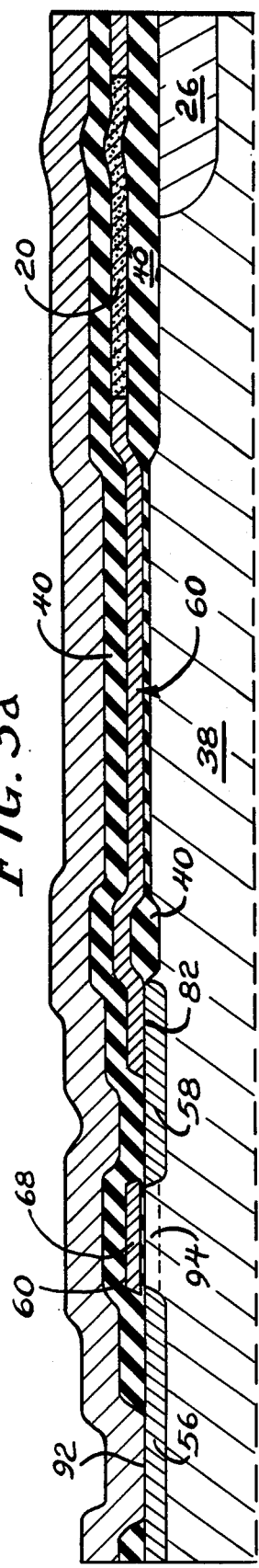
Figure 3B:
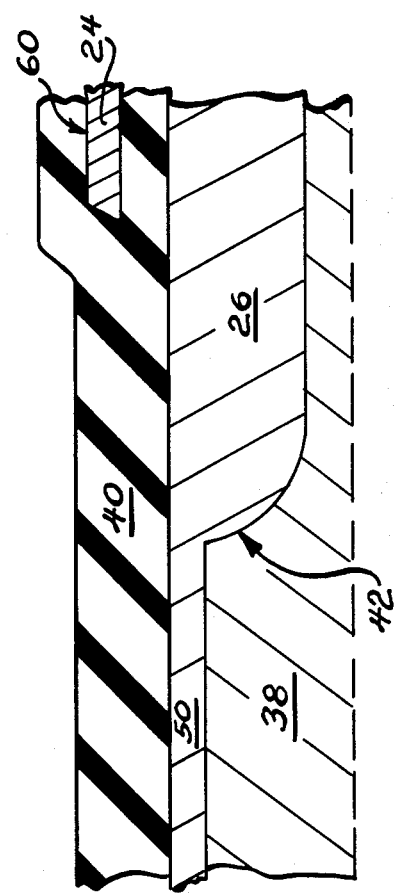

Referring to FIGS. 1 and 3a–3d, an N+ region 42 in the P− substrate 38 creates a conductivity region for forming the buried ground line 26 and the drain regions 44, 48, 52, and 56 and the source regions 46, 50, 54, and 58 of the transistors 16, 18, 28, and 30, respectively. As shown in FIGS. 3a, b, and d, the buried ground line 26 is a thicker N+ layer than the drain and source regions 44-58 because the ground line is doped with phosphorous, whereas the drain and the source regions are doped with arsenic. The source regions 46 and 50 of the driver transistors 16 and 18 overlap or are connected to the buried ground line 26. Otherwise, the buried ground line is isolated from the remainder of the cell 10 by insulation region 40.

A polycrystalline silicon region 60 is formed within insulation region 40 and above N+ region 42 to provide a second conductivity region. The polysilicon region is separated into portions 62 and 64. The word line 36 and the gate regions 66 and 68 of transfer transistors 28 and 30, respectively, share the common portion 62. The separated portion 64 delineates the gate regions 70 and 72 of driver transistors 16 and 18, respectively, as well as load resistors 20 and 22 and the Vcc line 24. Valuable space in the cell 10 is saved because the Vcc line 24 is oriented directly above and parallel to the buried Vss line 26. The gate regions 70 and 72 are respectively connected to one end of load resistors 20 and 22. The other ends of load resistors 20 and 22 are adjacent and perpendicular to Vcc line 24. The load resistors 20 and 22 maintain high resistivity characteristics as they are formed from a lighter doped polysilicon area in the portion 64.

The source region 54 of transfer transistor 28 is connected to the gate region 70 of driver transistor 16 at contact area 74. Similarly, the gate region 70 of driver transistor 16 is connected to the drain region 48 of driver transistor 18 at contact area 76. As a result, connection 78 (See FIG. 2) is formed between the source region 54 of the transfer transistor 28, the gate region 70 of the driver transistor 16, and the drain region 48 of driver transistor 18. A corresponding connection 80 (See FIG. 2) is formed at contact area 82 between the source region 58 of transfer transistor 30, the gate region 72 of driver transistor 18 and the drain region 44 of driver transistor 16.

An aluminum region 84 having dopants therein such as silicon and copper is formed on the top surface of the insulation region 40 above both the N+ diffusion region 42 and the polysilicon region to delineate the data lines 32 and 34. Each data line forms a connection with a corresponding drain region of a transfer transistor. One connection 86 is created at contact area 88 where data line 32 penetrates the insulation region 40 to the drain region 52 of transfer transistor 28. The other connection 90 is created at contact area 92 where data line 34 penetrates the insulation region 40 to the drain region 56 of transfer transistor 30. The contact areas 88 and 92 or, alternatively, the connections 84 and 90 are commonly shared by the adjacent memory cell 12.

A process for making a preferred embodiment of the single polysilicon cell 10, as described above, will now be discussed. A slice of P− type, monocrystalline semiconductor silicon material is used as the substrate 38. The single cell structure which is fabricated on the wafer represents only a very small portion of the wafer area. Initially, the wafer is covered with a silicon nitride layer (not shown). Then certain areas of the silicon nitride layer are etched off. Thereafter, a layer of insulation material is conventionally grown on the regions of the substrate not blocked by the silicon nitride. Subsequently, the remaining portions of silicon nitride are etched off. Now, the formation of the memory cell begins. First, a buried ground line is implanted into the P− wafer by doping a non-oxidized portion of the substrate with N+ type impurities. Thereafter, enhancement implanting occurs in the substrate 38 below the future gate regions and between the future drain regions and the future source regions of the soon to be enhancement mode transistors 16, 18, 28, and 30. Thin layers at these specific regions in the substrate are P+ type doped to insure better on and off characteristics for the enhancement mode transistors. Enhancement layers 94 and 96 are respectively shown in FIGS. 3a and 3c for transistors 30 and 28. The enhancement layers are not shown for transistors 16 and 18.

In the next step of the process, a layer of insulation material is deposited over the entire wafer. Subsequently, portions of the insulation material are etched off in order to expose contact areas 74, 76, and 82 on future source region 54, future drain region 48, and future source and drain regions 58 and 44, respectively.

In the following step, a layer of polycrystalline silicon is deposited onto the surface of the wafer. As a result, the contact areas 74, 76, and 82 are covered. Thereafter, certain areas of the polysilicon layer are N− type doped. Subsequently, a mask is utilized in etching off portions of the polysilicon layer to form gate regions, interconnects, and load resistor regions.

Next, the drain regions and the source regions of the driver transistors 16 and 18 and transfer transistors 28 and 30 are implanted into second portions of the substrate. The source regions 46 and 50 of the driver transistors 16 and 18 are implanted in such a manner as to overlap with the buried Vss line 26. The remaining polysilicon layer is concurrently N type doped except for the load resistor regions which block the N type doping with a resistor mask.

The process is continued by depositing another layer of insulation material. It should be noted at this point, that the total of deposited silicon dioxide layers combine to form a homogenous insulation region which encloses the polysilicon layer therein except at the contact areas 74, 76, and 82. In the next step, portions of the insulation material are etched off down to contact areas 88 and 92 on the drain regions 52 and 54 of the transfer transistors 28 and 30. Thereafter, a metal layer of aluminum is deposited over the entire wafer so as to be connected to the drain regions 52 and 54 of the transfer transistors 28 and 32. In a final step, aluminum is etched off portions of the metal layer to delineate a pair of data lines connected to contact areas 88 and 92. This completes the fabrication of the memory cell. However, a passivation oxide (not shown) may be deposited over the wafer as a protection barrier.

In the above description, specific details of an embodiment of the invention have been provided for a thorough understanding of the inventive concepts. It will be understood by those skilled in the art that many of these details may be varied without departing from the spirit and scope of the invention.

What is claimed is:

1. A memory cell structure on a substrate of semiconductor material having first and second cross-coupled driver field effect transistors and first and second load resistors arranged in conjunction with a power supply line and a ground line to form a flip-flop, and having first and second transfer transistors arranged in conjunction with a word line and first and second data lines for accessing data with the flip-flop, the components of the memory cell structure being formed in regions separated from each other by an insulation layer, wherein the improvement comprises:

a conductive region in the substrate delineating a ground line;

a single conductive layer above said substrate conductive region;

a metal region above said conductive layer, wherein the power supply line, the word address line and the resistors are located in the conductive layer closest to the substrate, and wherein said closet conductive layer crosses said conductive region in the substrate, whereby the memory cell can be formed substantially in a conductive region in the substrate, in a single layer of polysilicon, and in a metal layer thereby to provide a small cell which is simple to fabricate.

2. The improvement of claims 1, wherein said ground line is parallel to said supply line and perpendicular to the data lines.

3. The improvement of claim 2 wherein the power supply line is located directly above the ground line.

4. The improvement of claim 1, wherein said resistors are separated from said substrate by no conductive region or conductive layer.

5. The improvement of claim 1 wherein said conductive region in the substrate is of opposite conductivity thereto and delineates a buried ground line and the sources and drains of the driver and transfer transistors.

6. The improvement of claim 5 wherein said resistors are separated from said substrate by no conductive region or conductive layer.

7. The improvement of claim 6 wherein said metal region defines said data lines.

8. The memory cell structure of claim 1 wherein said first and second load resistors are oriented perpendicular to the power supply line and the ground line.

9. The memory cell structure of claim 8 wherein the first and second data lines are oriented perpendicular to the power supply line and the buried ground line.

10. A memory cell structure on a substrate of semiconductor material having first and second cross-coupled driver field effect transistors and first and second load resistors arranged in conjunction with a power supply line and a ground line to form a flip-flop, and having first and second transfer transistors arranged in conjunction with a word line and first and second data lines for accessing data from the flip-flop, the components of the memory cell structure being formed in regions separated from each other by an insulation layer, wherein the improvement comprises:

a conductive region in the substrate delineating the ground line said ground line having a conductivity opposite to the conductivity of the substrate;

a polysilicon layer located above said conductive region and defining the word line, first and second load resistors and the power supply line, said resistors being separated from the substrate by no conductive region or conductive layer; and a metal region on the surface of the insulation layer above said first polysilicon layer delineating the first and second data lines.

11. The improvement of claim 10 wherein said ground line is parallel to said supply line and perpendicular to the data lines.

12. The improvement of claim 11 wherein the power supply line is located directly above the ground line.

13. The improvement of claim 10 wherein said polysilicon conductive layer crosses said conductive region in the substrate.

14. The improvement of claim 10 wherein said first and second load resistors are oriented perpendicular to the power supply line and the ground line.

15. The improvement of claim 14 wherein the first and second data lines are oriented perpendicular to the power supply line and the buried ground line.

16. The improvement of claim 10 wherein said ground line is buried in the substrate and wherein said substrate conductive region also defines sources and drains of the driver and transfer transistors.

17. A memory cell structure on a substrate of semiconductor material having first and second cross-coupled driver field effect transistors and first and second load resistors arranged in conjunction with a power supply line and a ground line to form a flip-flop, and having first and second transfer transistors arranged in conjunction with a word line and first and second data lines for accessing data from the flip-flop, the components of the memory cell structure being formed in regions separated from each other by an insulation layer, wherein the improvement comprises:

a conductive region in the substrate delineating the ground line;

a single polysilicon layer above said substrate conductive region defining the first and second load resistors, said resistors being separated from said substrate by no conductive region or conductive layer;

a metal region on the surface of the insulation layer above said polysilicon layer delineating the first and second data lines.

18. The improvement of claim 17 wherein said power supply line is located in said polysilicon layer, and wherein said ground line is parallel to said supply line and perpendicular to the data lines.

19. The improvement of claim 18 wherein said power supply line is located directly above the ground line.

20. The improvement of claim 17 wherein said polysilicon layer crosses said conductive region in the substrate.

21. The memory cell structure of claim 17 wherein said first and second load resistors are oriented perpendicular to the power supply line and the ground line.

22. The memory cell structure of claim 21 wherein the first and second data lines are oriented perpendicular to the power supply line and the buried ground line.

23. A memory cell structure on a substrate of semiconductor material having first and second cross-coupled driver field effect transistors and first and second load resistors arranged in conjunction with a powr supply line and a ground line for form a flip-flop, and having first and second transfer transistors arranged in conjunction with a word line and first and second data lines for accessing data from the flip-flop, the components of the memory cell structure being formed in regions separated from each other by an insulation layer, where the improvement comprises:

a conductive region defining a buried ground line in the substrate and having a conductivity different from the conductivity thereof;

a single polysilicon layer within the insulation layer and above said substrate conductive region, wherein said single polysilicon layer defines said load resistors and said power supply line which are located in the conductive layer closest to the substrate and cross said conductive regions in the substrate; and a metal region on the surace of the insulation layer above said single polysilicon layer; said elements of t..e memory cell being formed in said conductive region in the substrate, in said single polysilicon layer, and in said metal region.

24. The improvement of claim 23 wherein said ground line is parallel to said power supply line and perpendicular to the data lines.

25. The improvement of claim 24 wherein the power supply line is located directly above the ground line.

26. The improvement of claim 23 wherein said resistors are separated from said substrate by no conductive region or conductive layer.

27. The improvement of claim 23 wherein said polysilicon layer crosses said conductive region in the substrate.

28. A memory cell structure on a substrate of semiconductor material having first and second cross-coupled driver field effect transistors and first and second load resistors arranged in conjunction with a power supply line and a ground line to form a flip-flop, and having first and second transfer transistors arranged in conjunction with a word line and first and second data lines for accessing data with the flip-flop, the components of the memory cell structure being formed in regions separated from each other by an insulation layer and comprising:

a conductive region in the substrate to delineate a buried ground line and the sources and the drains of the driver and the transfer transistors, the buried ground line being connected to the source regions of the first and second driver transistors;

a second, conductive single layer within the insulation layer and above said first conductive region to define a first portion and a separated second portion, neither of said portions overlying the other of said portions, said first conductive portion forming the word line, said second conductive portion delineating the gate regions of the driver transistors and the first and second load resistors and the power supply line, the power supply line being oriented directly above and parallel to the buried ground line, said resistors being separated from the substrate by no conductive region or conductive layer;

said second portion penetrating the insulation layer to said first conductive region to form a first connection and a second connection, said first connection being between the source of the second transfer transistor and the gate of the second driver transistor and the drain of the first driver transistor, said second connection being between the source of the first transfer transistor and the gate of the first driver transistor and the drain of the second driver transistor;

a metal region on the surface of the insulation layer above said first conductive region and above said second conductive layer to delineate the first and second data lines, said metal region penetrating the insulation layer to said conductive region in the substrate to form a third connection and a fourth connection, said third connection being between the first data line and the drain region of the first transfer transistor, said fourth connection being between the second data line and the drain region of the second transfer transistor.

29. The memory cell structure of claim 28 wherein said conductive region in the substrate is formed of N+ doped silicon, said conductive layer is formed of N− doped polycrystalline silicon, and said metal region is formed of aluminum.

30. The memory cell structure of claim 28 wherein said first and second load resistors in said second portion are formed of a lighter doped polycrystalline silicon than the remainder of the second portion.

31. The memory cell structure of claim 28 wherein said first and second load resistors are oriented perpendicular to the power supply line and the ground line.

32. The memory cell structure of claim 31 wherein the first and second data lines are oriented perpendicular to the power supply line and the buried ground line.

33. The memory cell structure of claim 28 wherein said third and fourth connections are commonly shared by a first adjacent memory cell.

34. The improvement of claim 28 wherein said polysilicon layer crosses said conductive region in the substrate.

* * * * *